United States Patent
Tanaka et al.

(10) Patent No.: US 6,518,102 B1
(45) Date of Patent: *Feb. 11, 2003

(54) METHOD FOR MANUFACTURING TRANSISTOR SEMICONDUCTOR DEVICES WITH STEP OF ANNEALING TO GETTER METAL WITH PHOSPHOROUS

(75) Inventors: Koichiro Tanaka, Kanagawa (JP); Hideto Ohnuma, Kanagawa (JP)

(73) Assignee: Semiconductor Energy Laboratory Co., Ltd., Kanagawa-ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/928,750

(22) Filed: Sep. 12, 1997

Related U.S. Application Data

(63) Continuation of application No. 08/622,828, filed on Mar. 27, 1996, now abandoned.

(30) Foreign Application Priority Data

Mar. 27, 1995 (JP) ................................. 7-094410

(51) Int. Cl.[7] ............................................. H01L 21/335
(52) U.S. Cl. ........................................ 438/143; 438/153
(58) Field of Search ...................... 438/153, 152, 438/151, 150, 149, 142, 143, 147, 172, 157, 64, 65, 66, 75; 257/57, 64, 65, 66, 75

(56) References Cited

U.S. PATENT DOCUMENTS

| | | | |
|---|---|---|---|
| 5,244,819 A | * | 9/1993 | Yue .............................. 438/402 |
| 5,275,851 A | * | 1/1994 | Fonash et al. ............... 438/479 |
| 5,292,675 A | * | 3/1994 | Codama ....................... 438/163 |
| 5,308,998 A | * | 5/1994 | Yamazaki et al. ............ 257/57 |
| 5,341,012 A | | 8/1994 | Misawa et al. .............. 257/351 |
| 5,426,064 A | | 6/1995 | Zhang et al. |
| 5,481,121 A | | 1/1996 | Zhang et al. |
| 5,488,000 A | | 1/1996 | Zhang et al. |
| 5,403,772 A | | 4/1995 | Zhang et al. |
| 5,492,843 A | | 2/1996 | Adachi et al. |
| 5,501,989 A | * | 3/1996 | Takayama et al. .......... 438/155 |
| 5,508,209 A | * | 4/1996 | Zhang et al ................. 438/162 |

(List continued on next page.)

FOREIGN PATENT DOCUMENTS

| | | | |
|---|---|---|---|
| JP | 1-260856 | * | 10/1989 |
| JP | 3-93233 | * | 4/1991 |

(List continued on next page.)

OTHER PUBLICATIONS

Liu et al., "An Experimental Study on the Short–Channel Effects in Undergated Polysilicon Thin–Film Transistors with and without Lightly Doped Drain Structures", Mar. 1993, IEEE Electron Letters, vol. 14, No. 3, pp. 149–151.*

Wolf, Silicon Prcessing for the VLSI era vol. 2: Process Integration, 1990, Lattice Press, pp. 354–361.*

(List continued on next page.)

*Primary Examiner*—Michael Sherry
*Assistant Examiner*—Evan Pert
(74) *Attorney, Agent, or Firm*—Fish & Richardson P.C.

(57) ABSTRACT

A method for producing a thin-film transistor by using a crystalline silicon film that has been formed by using nickel as a metal element for accelerating crystallization of silicon. In forming source and drain regions, phosphorus as an element for gettering nickel is introduced therein by ion implantation. Nickel gettering is effected by annealing. For example, in the case of producing a P-channel thin-film transistor, both phosphorus and boron are used. Boron determines a conductivity type, and phosphorus is used as a gettering material.

71 Claims, 5 Drawing Sheets

U.S. PATENT DOCUMENTS

| | | | |
|---|---|---|---|
| 5,508,533 A | 4/1996 | Takemura | 257/64 |
| 5,529,937 A | 6/1996 | Zhang et al. | |
| 5,534,716 A | 7/1996 | Takemura | 257/72 |
| 5,543,352 A | 8/1996 | Ohtani et al. | |
| 5,563,426 A | 10/1996 | Zhang et al. | |
| 5,569,610 A | 10/1996 | Zhang et al. | |
| 5,569,936 A | 10/1996 | Zhang et al. | 257/66 |
| 5,580,792 A | 12/1996 | Zhang et al. | |
| 5,585,291 A | 12/1996 | Ohtani et al. | |
| 5,589,694 A | 12/1996 | Takayama et al. | 257/67 |
| 5,595,923 A | 1/1997 | Zhang et al. | |
| 5,595,944 A | 1/1997 | Zhang et al. | |
| 5,604,360 A | 2/1997 | Zhang et al. | |
| 5,605,846 A | 2/1997 | Ohtani et al. | |
| 5,606,179 A | 2/1997 | Yamazaki et al. | 257/59 |
| 5,608,232 A | 3/1997 | Yamazak et al. | |
| 5,612,250 A | 3/1997 | Ohtani et al. | 257/66 |
| 5,614,426 A | 3/1997 | Funada et al. | |
| 5,614,733 A | 3/1997 | Zhang et al. | 257/66 |
| 5,616,506 A | 4/1997 | Takemura | 438/150 |
| 5,620,905 A * | 4/1997 | Konuma et al. | 438/163 |
| 5,620,910 A | 4/1997 | Teramoto | 438/151 |
| 5,621,224 A | 4/1997 | Yamazaki et al. | 257/66 |
| 5,624,851 A | 4/1997 | Takayama et al. | 438/166 |
| 5,637,515 A | 6/1997 | Takemura | 438/162 |
| 5,639,698 A | 6/1997 | Yamazaki et al. | |
| 5,643,826 A | 7/1997 | Ohtani et al. | |
| 5,646,424 A | 7/1997 | Zhang et al. | 257/66 |
| 5,654,203 A | 8/1997 | Ohtani et al. | 438/97 |
| 5,656,825 A | 8/1997 | Kusumoto et al. | 257/66 |
| 5,663,077 A | 9/1997 | Adachi et al. | 438/151 |
| 5,677,549 A | 10/1997 | Takayama et al. | 257/66 |
| 5,696,386 A | 12/1997 | Yamazaki | 257/57 |
| 5,696,388 A | 12/1997 | Funada et al. | 257/64 |
| 5,700,333 A | 12/1997 | Yamazaki et al. | 136/258 |
| 5,705,829 A | 1/1998 | Miyanaga et al. | 257/66 |
| 5,712,191 A | 1/1998 | Nakajima et al. | |
| 5,744,822 A | 4/1998 | Takayama et al. | 257/66 |
| 5,744,824 A | 4/1998 | Kousai et al. | 257/74 |
| 5,756,364 A | 5/1998 | Tanaka et al. | |
| 5,766,977 A | 6/1998 | Yamazaki | 438/151 |
| 5,767,930 A | 6/1998 | Kobayashi et al. | 349/42 |
| 5,773,327 A | 6/1998 | Yamazaki et al. | 438/154 |
| 5,773,846 A | 6/1998 | Zhang et al. | 257/66 |
| 5,773,847 A | 6/1998 | Hayakawa | 257/66 |
| 5,783,468 A | 7/1998 | Zhang et al. | 438/166 |
| 5,789,284 A | 8/1998 | Yamazaki et al. | |
| 5,795,795 A | 8/1998 | Kausai et al. | |
| 5,808,321 A | 9/1998 | Mitanaga et al. | 257/72 |
| 5,811,327 A | 9/1998 | Funai et al. | 438/166 |
| 5,814,540 A | 9/1998 | Takemura et al. | 438/166 |
| 5,818,076 A | 10/1998 | Zhang et al. | 257/255 |
| 5,821,138 A | 10/1998 | Zhang et al. | 438/150 |
| 5,824,573 A | 10/1998 | Zhang et al. | 438/150 |
| 5,824,574 A | 10/1998 | Yamazaki et al. | 438/150 |
| 5,830,784 A | 11/1998 | Zhang et al. | |
| 5,837,619 A | 11/1998 | Adachi et al. | 438/795 |
| 5,840,118 A | 11/1998 | Yamazaki | 117/103 |
| 5,843,225 A | 12/1998 | Takayama et al. | 227/8 |
| 5,843,833 A | 12/1998 | Takayama et al. | 117/8 |
| 5,851,862 A | 12/1998 | Ohtani et al. | 438/166 |
| 5,858,823 A | 1/1999 | Yamazaki et al. | 438/166 |
| 5,869,362 A | 2/1999 | Ohtani | 438/166 |
| 5,869,363 A | 2/1999 | Yamazaki et al. | 438/166 |
| 5,877,513 A * | 3/1999 | Koyama et al. | 257/66 |
| 5,879,977 A | 3/1999 | Zhang et al. | 438/166 |
| 5,882,960 A | 3/1999 | Zhang et al. | 438/166 |
| 5,886,366 A | 3/1999 | Yamazaki et al. | 257/59 |
| 5,888,857 A | 3/1999 | Zhang et al. | 438/162 |
| 5,888,858 A | 3/1999 | Yamazaki et al. | 438/162 |
| 5,893,730 A | 4/1999 | Yamazaki et al. | |
| 5,897,347 A | 4/1999 | Yamazaki et al. | 438/166 |
| 5,904,770 A | 5/1999 | Ohtani et al. | 117/103 |
| 5,915,174 A | 6/1999 | Yamazaki et al. | |
| RE36,314 E * | 9/1999 | Yamazaki et al. | 257/57 |
| 5,949,115 A | 9/1999 | Yamazaki et al. | |
| 5,956,579 A | 9/1999 | Yamazaki et al. | |
| 5,961,743 A | 10/1999 | Yamazaki et al. | |
| 5,977,559 A | 11/1999 | Zhang et al. | |
| 5,985,740 A | 11/1999 | Yamazaki et al. | |
| 6,027,987 A | 2/2000 | Yamazaki et al. | |
| 6,048,758 A | 4/2000 | Yamazaki et al. | |
| 6,063,654 A | 5/2000 | Ohtani | |
| 6,066,518 A | 5/2000 | Yamazaki | |
| 6,071,764 A | 6/2000 | Zhang et al. | |
| 6,071,766 A | 6/2000 | Yamazaki et al. | |
| 6,072,193 A | 6/2000 | Ohnuma et al. | |
| 6,077,731 A | 6/2000 | Yamazaki et al. | |
| 6,077,758 A | 6/2000 | Zhang et al. | |
| 6,084,247 A | 7/2000 | Yamazaki et al. | |
| 6,087,679 A | 7/2000 | Yamazaki et al. | |
| 6,093,934 A | 7/2000 | Yamazaki et al. | |
| 6,100,562 A | 8/2000 | Yamazaki et al. | |
| 6,121,660 A | 9/2000 | Yamazaki et al. | |
| 6,133,075 A | 10/2000 | Yamazaki et al. | |
| 6,146,930 A * | 11/2000 | Kobayashi et al. | 438/154 |
| 6,180,957 B1 * | 1/2001 | Miyasaka et al. | 257/57 |

FOREIGN PATENT DOCUMENTS

| | | | |
|---|---|---|---|
| JP | 5-55232 | * | 3/1993 |
| JP | 5-109737 | * | 4/1993 |
| JP | 5-235025 | * | 9/1993 |
| JP | 6-224217 | * | 6/1994 |
| JP | 6-267988 | * | 9/1994 |
| JP | 6-275807 | * | 9/1994 |
| JP | 7-202209 | * | 8/1995 |
| JP | 2000-196095 | | 7/2000 |

OTHER PUBLICATIONS

Liu & Lee, "An Experimental Study on the Short–Channel Effects in Undergated Polysilicon Thin–Film Transistors with and without Lightly Doped Drain Structures", Mar. 1993, IEEE Electron Device Letters, vol. 14, No. 3, pp. 149–151.*

Liu et al., "Inverted Thin–Film Transistors with a Simple Self–Aligned Lightly Doped Drain Structure", Dec. 1992, IEEE Transactions on Electron Devices, vol. 39, No. 12, pp. 2803–2809.*

Lee et al., "High Reliability and High Performance 0.35 um Gate–Inverted TFTs for 16Mbit SRAM Applications Using Self–Aligned LDD Structures", Dec. 1992, Electron Devices Meeting. Technical Digest., International, pp. 823–826.*

Tsutsumi et al., "A High–Performance SRAM Memory Cell with LDD–TFT Loads", May 1991, VLSI Technology, 1991. Digest of Technical Papers., 1991 Symposium on, pp. 23–24.*

Wolf, Silcion Process for the VLSI Era, vol. 2: Oprocess Integration, 1990, Lattice Press, pp. 354–361.*

Mishima, et al., "Implantation Temperature Effect on Poly-crystalline Silicon by Ion Shower Doping", J. Appl. Phys. 74 (12), pp. 7114–7117; Dec. 15, 1993.

Matsuo, et al., "Low–Temperature Activation of Impurities Implanted by Ion Doping Technique for Poly–Si Thin–Film Transistors", Jpn. J. Appl. Phys. vol. 31, pp. 4567–4569; Part 1, No. 12B, Dec. 1992.

* cited by examiner

METHOD FOR MANUFACTURING TRANSISTOR SEMICONDUCTOR DEVICES WITH STEP OF ANNEALING TO GETTER METAL WITH PHOSPHOROUS

This is a continuation of application Ser. No. 08/622,828, filed Mar. 27, 1996, now abandoned.

BACKGROUND OF THE INVENTION

1. Field of the Invention

The present invention relates to a doping technique in a manufacturing process of an insulated-gate semiconductor device, such as a thin-film transistor (TFT), having a non-single-crystal crystalline silicon film and other semiconductor devices which doping technique minimizes adverse effects on such a device of an impurity (e.g., Ni) contained in the crystalline silicon film. The invention is particularly advantageous when the crystalline silicon film is one that has been formed with the aid of a crystallizing catalyst element (e.g., Ni).

2. Description of the Related Art

In recent years, various studies have been made of insulated-gate semiconductor devices having a thin-film active layer (active region) on an insulative substrate. In particular, a thin-film, insulated-gate transistor, i.e., what is called a thin-film transistor (TFT) has been studied enthusiastically. Thin-film transistors are classified into an amorphous silicon TFT, a crystalline silicon TFT, etc. depending on the material and the crystal state of a semiconductor used. Since "crystalline silicon" mentioned above is non-single-crystal silicon, the above TFTs are generically called non-single-crystal TFTs.

In general, amorphous semiconductors have small electric field mobilities, and therefore cannot be used for a TFT that is required to operate at high speed. Further, P-type amorphous silicon has a very small electric field mobility, which means that amorphous silicon cannot provide a P-channel TFT (PMOS TFT). Therefore, amorphous silicon does not allow formation of a complementary MOS (CMOS) circuit by combining P-channel TFTs and N-channel TFTs (NMOS TFTs).

On the other hand, crystalline semiconductors have larger electric field mobilities than amorphous semiconductors, and hence enable high-speed operation. Since crystalline silicon can provide a PMOS TFT as well as an NMOS TFT, it allows formation of a CMOS circuit.

A non-single-crystal crystalline silicon film can be obtained by thermally annealing, for a long time at a proper temperature (usually more than 600° C.), an amorphous silicon film that has been produced by vapor-phase growth, or by application of strong light such as laser light (optical annealing).

In the thermal annealing method, as described in Japanese Unexamined Patent Publication No. Hei. 6-244104, a crystalline silicon film can be obtained by a thermal annealing process that is shorter and lower in temperature than usual cases by using an effect that an element such as nickel, iron, cobalt, platinum, palladium, or the like (hereinafter called a crystallizing catalyst element or simply a catalyst element) accelerates crystallization of amorphous silicon.

Similar techniques are disclosed in Japanese Unexamined Patent Publication Nos. Hei. 6-318701, 6-333951, etc. It has also been revealed that in a silicon film having such a crystallizing catalyst element, thermal annealing that is lower in temperature than conventional cases enables activation of an impurity element which is performed after impurity regions such as a source and a drain are formed by implanting N-type or P-type impurity ions by ion doping or the like. (Japanese Unexamined Patent Publication Nos. Hei. 6-267980 and Hei. 6-267989)

For the above purpose, it is desired that the concentration of a crystallizing catalyst element be $1 \times 10^{15}$ to $1 \times 10^{19}$ atoms/cm$^3$. Crystallization is not accelerated if the concentration is lower than this range, while the characteristics of a silicon semiconductor are impaired if the concentration is higher than this range. It is noted that the concentration of a catalyst element is defined as a minimum of values obtained by an analysis according to the secondary ion mass spectrometry (SIMS). In many cases, a catalyst element is distributed in a film.

Although semiconductor devices produced by using a crystalline silicon film containing a catalyst element for accelerating crystallization have a large electric field mobility, many of those exhibit a large off-current. In particular, where a large number of semiconductor devices are formed on the same substrate, large off-currents, which in itself are undesirable, have a large variation among the semiconductor devices.

Large off-currents and their large variation are believed due to the existence of the catalyst element for accelerating crystallization; that is, mainly due to the fact that the catalyst element exists in junctions.

In particular, the above undesired characteristics are fatal to TFTs that constitute a pixel section of a liquid crystal display.

SUMMARY OF THE INVENTION

Among semiconductor devices produced by using a crystalline silicon film into which nickel was introduced as a catalyst element for accelerating crystallization, those whose impurity regions (sources and drains, etc.) were formed by implanting phosphorus showed relatively low off-currents (about 10 pA or less) with almost no variation. Based on this fact, the inventors have studied properties of phosphorus in detail, and have found a report stating that phosphorus has a feature of gettering impurities.

According to this report, phosphorus shows a particularly high degree of gettering function with respect to nickel. Further, elements, such as copper and iron, which are considered to adversely affect semiconductor devices, can be gettered by phosphorus. This lead to an assumption that in the above semiconductor devices, phosphorus neutralizes the properties of nickel in a certain manner, to thereby suppress the adverse effects of nickel on the off-current characteristic.

The invention utilizes the gettering function of phosphorus with respect to nickel. "The gettering function" is defined as operation that phosphorus captures nickel,thereby reducing the effects of nickel.

For example, process for manufacturing a n-channel type thin film transistor using the nickel function will be explained as follows.

First, source and drain regions are formed by doping phosphorus ions using a gate electrode as a mask.

A channel region and n-type source and drain regions are formed in an active region of the thin film transistor by the phosphorus ion doping.

After that, thermal annealing or laser annealing is performed. In this process, nickel elements are removed from the channel region that no phosphorus is doped by the function of phosphorus doped in the source and drain regions.

That is, the nickel elements are captured by phosphorus and thereby the nickel elements are transferred from the channel region into the source and drain regions.

In the result of the thermal annealing or laser annealing process described above, the nickel elements gather into the source and drain regions. On the other hand, nickel elements are reduced in the region that no phosphorus is doped. The nickel elements doped highly in the channel region affects operation of the thin film transistor adversely.

In operation of the thin film transistor, it is required that resistance of the channel region is slightly changed by a voltage applied for the gate electrode. That is, slight change of electric property is needed for the channel region. However, the nickel disturbs the slight change.

Consequently, the Off-current is increased and the characteristics of the thin film transistor fluctuates.

On the other hand, even if nickel is highly doped in the source and drain regions, the off-current is not almost increased and the characteristic does not almost affect.

Accordingly, it is excessively effective for enhancing the characteristic of the thin film transistor to change distribution of nickel in the active region, that is, to increase concentration of nickel in source and drain regions and reduce concentration thereof in the channel region, relatively.

Where a p-channel type thin film transistor is manufactured, phosphorus ions are doped into the source and drain regions and p-type impurities are doped therein to invert the conductivity type. Thereby, the nickel is transferred into the source and drain regions.

In the invention described above, the catalyst element for accelerating crystallization may be a metal element such as nickel, platinum, cobalt, iron, palladium, or the like. Among those elements, nickel is particularly superior in the effect of accelerating crystallization of silicon.

It is preferred that the concentration of the catalyst element be set in a range of $1 \times 10^{15}$ to $1 \times 10^{19}$ atoms/cm$^3$. If the concentration is lower than $1 \times 10^{15}$ atoms/cm$^3$, the effect of accelerating crystallization is not attained. On the other hand, if the concentration is higher than $1 \times 10^{19}$ atoms/cm$^3$, silicon partly assumes metallic properties to lose its semiconductor characteristics. It is noted that in this specification the concentration of a catalyst element in a silicon film is defined as a minimum of values obtained by an analysis and a measurement according to the secondary ion mass spectrometry (SIMS).

DETAILED DESCRIPTION OF THE PREFERRED EMBODIMENTS

Embodiment 1

This embodiment is directed to a method of producing an N-type semiconductor device having superior characteristics by forming an uncompleted transistor on a crystalline silicon film into which nickel as a catalyst element for accelerating crystallization has been introduced, then implanting ions including phosphorus ions into its source and drain regions by known ion doping (also called plasma doping) or ion implantation, and finally improving the crystallinity of the silicon film and activating impurities by thermal annealing or optical annealing (or both). In the following, "semiconductor devices having superior characteristics" means semiconductor devices in which off-currents are about 10 pA or less and variations of characteristics among devices are small. FIGS. 1A to 1F show a manufacturing process of this embodiment.

Figure 1A:
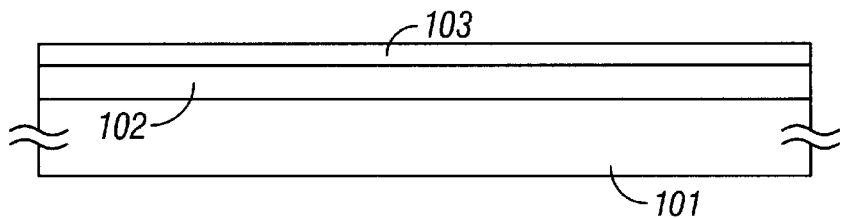
FIGS. 1A to 1F show a manufacturing process of a thin-film transistor according to first and second embodiments of the present invention.

First, a 2,000-Å-thick undercoat silicon oxide film 102 and a 500-Å-thick amorphous silicon film 103 are sequentially formed on a glass substrate (Corning 7059 in this embodiment) 101 by plasma CVD. A nickel acetate layer (not shown) is formed on the above structure by applying a nickel acetate aqueous solution of 10 ppm and performing spin coating. It is preferred that a surface active agent be added to the nickel acetate aqueous solution. (FIG. 1A)

Thereafter, thermal annealing is performed at 550° C. for 4 hours to crystallize the amorphous silicon film 103, i.e., obtain a crystalline silicon film 104. In this process, nickel serves as crystal nuclei, thereby accelerating crystallization of the amorphous silicon film 103.

It is due to this action of nickel that the above thermal annealing can be performed under the low-temperature (lower than the strain temperature of Corning 7059), short-time conditions of 550° C. and 4 hours. Details of the above steps are described in Japanese Unexamined Patent Publication No. Hei. 6-244104.

It is preferred that the concentration of the catalyst element be set in a range of $1 \times 10^{15}$ to $1 \times 10^{19}$ atoms/cm$^3$. In this embodiment, the concentration of the catalyst element in the silicon film is $1 \times 10$ to $5 \times 10^{18}$ atoms/cm$^3$ in terms of a minimum value in the film, which concentration is defined as a maximum of values obtained by an analysis and a measurement according to the secondary ion mass spectrometry (SIMS).

Figure 1B:
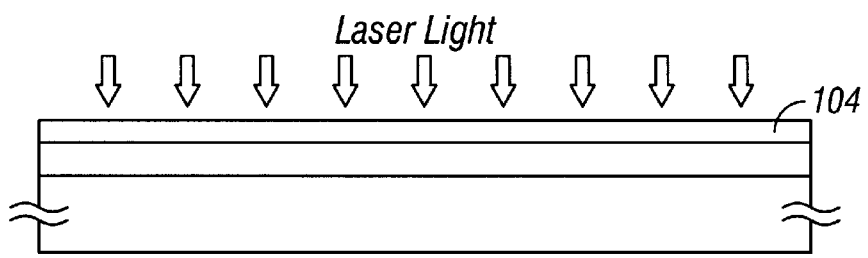

To improve the crystallinity of the above-obtained crystalline silicon film 104, it is illuminated with light emitted from an excimer laser that is a high-power pulsed laser. In this embodiment, a KrF excimer laser (wavelength: 248 nm; pulse width: 30 nsec) is used. The energy density of laser light is selected from a range of 100 to 500 mJ/cm$^2$ so as to provide the crystalline silicon film 104 with best crystallinity. In this embodiment, the laser light energy density is set at 370 mJ/cm$^2$. Where the area of an illumination object is larger than the beam size of the excimer laser light, the illumination is performed while the laser beam is moved relative to the illumination object. The illumination is so performed that each point on the illumination object receives 2 to 20 shots of laser light. The substrate temperature is kept at 200° C. during the laser light illumination. (FIG. 1B)

Figure 1C:
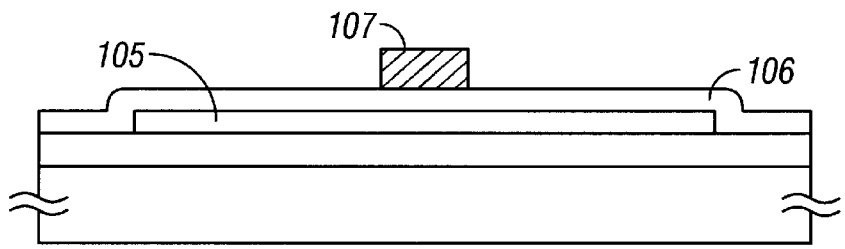

Then, the crystalline silicon film 104 is etched into an island-like silicon region 105. A 1,200-Å-thick silicon oxide film 106 as a gate insulating film is deposited thereon by plasma CVD using TEOS as a material gas, with the substrate temperature kept at 250 to 380° C., for instance, 3000° C. (FIG. 1C)

Subsequently, an aluminum film (containing silicon at 0.1 to 2%) is deposited by sputtering at a thickness of 3,000 to 8,000 Å, for instance, 6,000 Å, and then etched to form a gate electrode 107. (FIG. 1C)

Figure 1D:
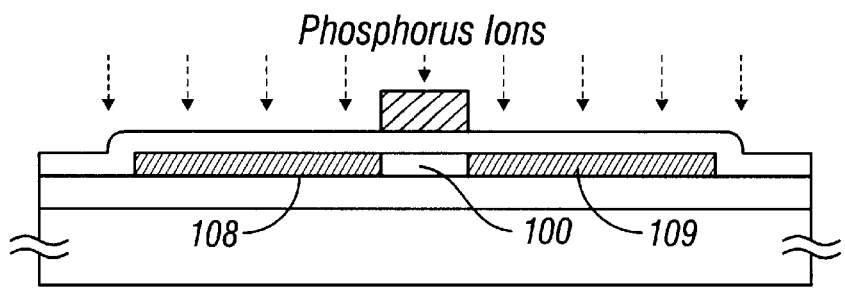

Thereafter, phosphorus ions are implanted into the island-like silicon region 105 with the gate electrode 107 used as a mask. Phosphine ($PH_3$) that is diluted with hydrogen to 1 to 10% is used as a doping gas. The acceleration voltage is set at 60 to 90 kV, for instance, 80 kV, and the dose is set at $1\times10^{13}$ to $8\times10^{15}$ atoms/cm², for instance, $2\times10^{14}$ atoms/cm³. Under these conditions, phosphorus ions are introduced into the island-like region 105 at a concentration of $3\times10^{19}$ atoms/cm³. Thus, N-type impurity regions 108 (source) and 109 (drain) and a channel region 100 are formed. (FIG. 1D)

According to the experiences of the inventors, the preferable range of concentration of an impurity for imparting N-type or P-type conductivity in a silicon region is $3\times10^{19}$ to $1\times10^{21}$ atoms/cm³. The substrate is kept at the room temperature during the ion doping.

Then, to activate phosphorus (dopant) and to cause phosphorus to getter nickel, optical annealing is performed by using a KrF excimer laser. The energy density of laser light is set at 100 to 350 mJ/cm², for instance, 250 mJ/cm². Where the area of an illumination object is larger than the beam size of excimer laser light, the illumination is performed while the laser beam is moved relative to the illumination object. The illumination is so performed that each point on the illumination object receives 2 to 20 shots of laser light. The substrate temperature is kept at 200° C. during the laser light illumination. Then, thermal annealing is performed at 350° C. for 2 hours in a nitrogen atmosphere. Although both optical annealing and thermal annealing are performed in this embodiment, only one of those may be performed.

Figure 1E:
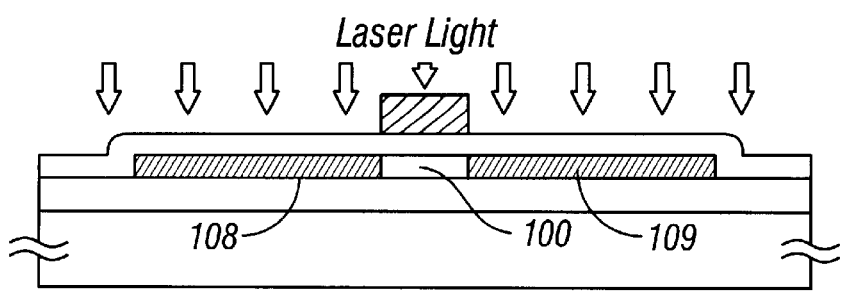

In the annealing process, nickel in the channel region 100 is transferred into the source region 108 and drain region 109. Thereby, concentration of nickel in the channel region 100 can be reduced.(FIG. 1E)

Figure 1F:
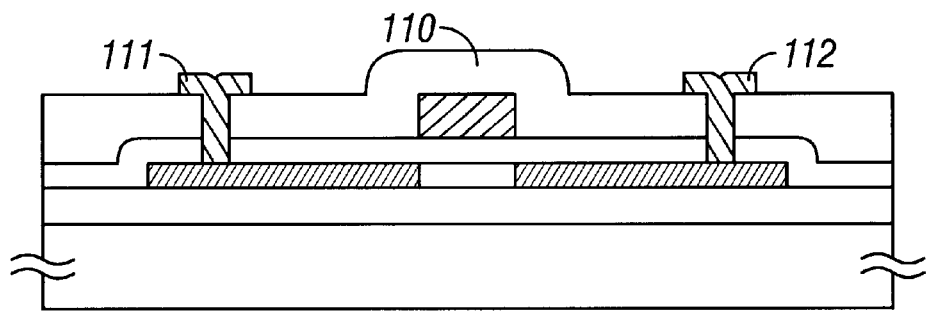

Subsequently, a 6,000-Å-thick silicon oxide film 110 as an interlayer insulating film is deposited by plasma CVD, and contact holes are formed therein. After a metal material, for instance, a multi-layer film of titanium and aluminum films is deposited and patterned to form electrode/wiring lines 111 and 112 of the source and drain of a TFT. Finally, thermal annealing is performed at 200 to 350° C. in a hydrogen atmosphere of 1 atm. (FIG. 1F)

Embodiment 2

This embodiment is directed to a method of producing a P-type semiconductor device having superior characteristics in a process of manufacturing a transistor by using a crystalline silicon film into which nickel as a catalyst element for accelerating crystallization has been introduced. More specifically, ions including phosphorus ions are implanted into source and drain regions of the crystalline silicon film by known ion doping (also called plasma doping), then a P-type impurity ions (in this embodiment, ions including boron ions) are further implanted into the silicon film, and finally thermal annealing or optical annealing (or both) is performed to improve the crystallinity of the silicon film and activate impurities.

This embodiment may be implemented by adding a step of implanting P-type impurity ions (in this embodiment, ions including boron ions) into the source and drain regions. This step may be performed before or after the phosphorus ion doping shown in FIG. 1D. Only the additional step of doping with P-type impurity ions will be described below.

In this embodiment, boron ions as P-type impurity ions are implanted into the silicon region 105 with the gate electrode 107 used as a mask. Diborane ($B_2H_6$) that has been diluted with hydrogen to 5% is used as a doping gas. The acceleration voltage is set at 60 to 90 kV, for instance, 80 kV, and the dose is set at $1\times10^{13}$ to $8\times10^{15}$ atoms/cm², for instance, $4\times10^{14}$ atoms/cm².

In this step, the dose is so adjusted that the maximum concentration value of boron in the source and drain regions minus that of phosphorus in the same regions becomes $3\times10^{19}$ to $1\times10^{21}$ atoms/cm³. The substrate is kept at the room temperature during the ion doping. Thus, P-type impurity regions 108 (source) and 109 (drain) and channel region 100 are formed.

In this embodiment, in forming the P-type TFT, not only the impurity for imparting P-type conductivity such as boron but also nickel and phosphorus are added to the active layer made of a crystalline silicon film. Therefore, a silicon film having good crystallinity can be obtained at a low temperature in a short time due to the catalyst effect of nickel, and nickel that has become unnecessary can be gettered by phosphorus. As a result, this embodiment can produce TFTs having superior electrical characteristics whose variations among devices are small.

That is, concentration of nickel in the channel region 100 can be reduced. Thereby, the thin film transistor having high characteristics and low fluctuation thereof can be obtained.

Embodiment 3

This embodiment is directed to a method of separately producing N-type and P-type semiconductor devices having superior characteristics on the same substrate by forming a plurality of uncompleted transistors on a crystalline silicon film into which nickel as a catalyst element for accelerating crystallization, then implanting ions including phosphorus ions into their source and drain regions by known ion doping (also called plasma doping), and finally selectively implanting P-type impurity ions (in this embodiment, ions including boron ions).

Figure 2A:
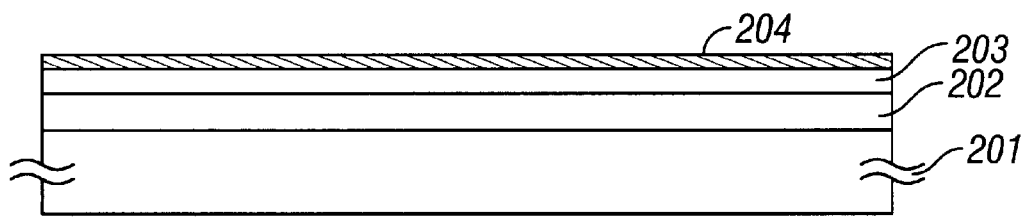
FIGS. 2A to 2F show a manufacturing process of a thin-film transistor according to a third embodiment of the invention.

FIGS. 2A to 2F shows a manufacturing process of CMOS TFTs according to this embodiment. First, as shown in FIG. 2A, an undercoat silicon oxide film 202 is deposited on a glass substrate (Corning 1737) 201 at a thickness of 1,000 to 5,000 Å, for instance, 2,000 Å, by plasma CVD using monosilane and nitrogen monoxide as materials. A 1,000-Å-thick amorphous silicon film 203 is deposited thereon by plasma CVD using monosilane as a material.

Thereafter, a very thin silicon oxide film (not shown) is formed on the surface of the amorphous silicon film 203 by using an aqueous solution of hydrogen peroxide. An acetate salt solution containing nickel at 1 to 30 ppm, for instance, 10 ppm, is applied by spin coating and then dried to form a catalyst layer 204 containing nickel. (FIG. 2A)

Subsequently, thermal annealing is performed at 550° C. for 4 hours in a nitrogen atmosphere to crystallize the amorphous silicon film 203. In this process, nickel moves from the amorphous silicon film 203 to the undercoat silicon oxide film 203, and crystallization proceeds downward.

After the crystallization step by thermal annealing, XeCl laser light (wavelength: 308 nm) is applied to the crystallized silicon film to enhance its crystallinity.

Figure 2B:
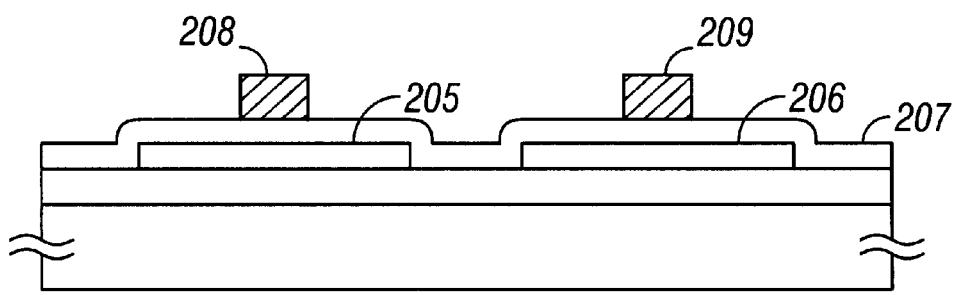

Then, as shown in FIG. 2B, the crystallized silicon film is etched into island-like silicon regions 205 and 206.

A 1,000-Å-thick silicon oxide film 207 as a gate insulating film is deposited thereon by plasma CVD using monosilane and nitrogen monoxide as materials.

Subsequently, an aluminum film (containing scandium at 0.1 to 2%) is deposited by sputtering at a thickness of 3,000 to 8,000 Å, for instance, 4,000 Å, and then etched to form gate electrodes 208 and 209.

Figure 2C:
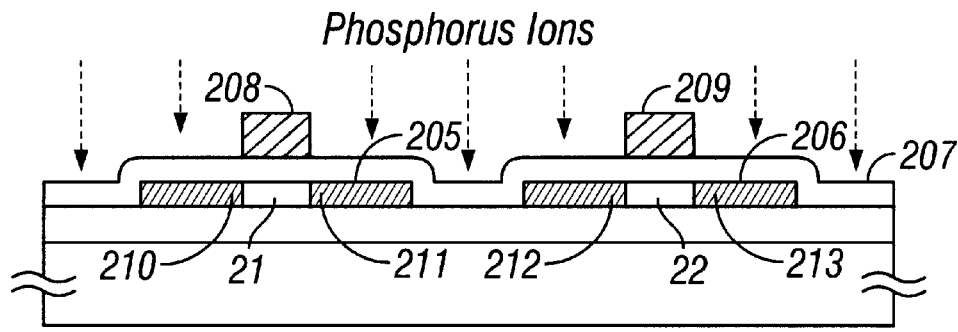

Then, as shown in FIG. 2C, the island-like silicon regions 205 and 206 are doped with phosphorus ions by ion doping in a self-aligned manner with the gate electrodes 208 and 209 used as a mask. Phosphine ($PH_3$) that is diluted with hydrogen to 1 to 10% is used as a doping gas. The acceleration voltage may be set at 60 to 90 kV, and the dose may be set at $1\times10^{13}$ to $8\times10^{15}$ atoms/cm$^2$. In this embodiment, the acceleration voltage is set at 80 kV, and the dose is set at $2\times10^{14}$ atoms/cm$^2$. Under these conditions, phosphorus ions are introduced into the island-like silicon regions 205 and 206 at a concentration of $3\times10^{19}$ atoms/cm$^3$, so that N-type impurity regions 210 to 213 are formed.

Figure 2D:
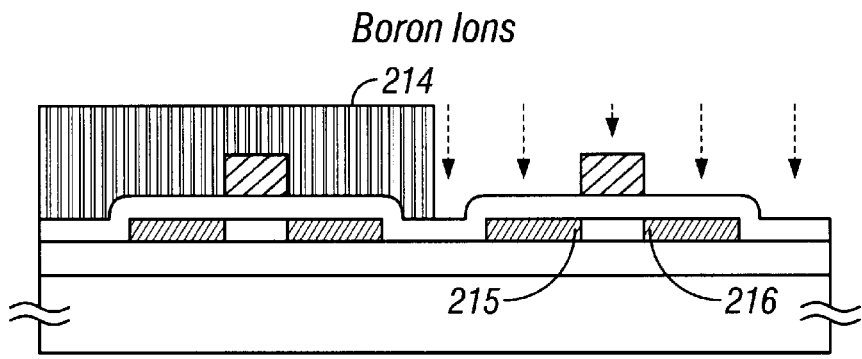

Thereafter, as shown in FIG. 2D, a region to become an N-type TFT is covered with a resist mask 214 by a known photoresist method. In this state, P-type impurity ions (in this embodiment, boron ions) are introduced into the island-like silicon region 206 by ion doping with the gate electrode 209 used as a mask. Diborane ($B_2H_6$) that is diluted with hydrogen to 5% is used as a doping gas. The acceleration voltage may be set at 60 to 90 kV, and the dose may be set at $1\times10^{13}$ to $8\times10^{15}$ atoms/cm$^2$. In this embodiment, the acceleration voltage is set at 80 kV and the dose is set at $4\times10^{14}$ atoms/cm$^2$. As a result, the conductivity type of the N-type impurity regions 212 and 213 of the island-like silicon region 206 is inverted to form P-type impurity regions 215 (source) and 216 (drain). On the other hand, the N-type conductivity of the impurity regions 210 and 211 that are covered with the resist mask 214 is maintained.

In the above step, the dose is so adjusted that the maximum concentration of boron in the source and drain regions 215 and 216 minus that of phosphorus in those regions becomes $3\times10^{19}$ to $1\times10^{21}$ atoms/cm$^3$. The substrate is kept at the room temperature during the ion doping.

Although in this embodiment boron ions are introduced after the phosphorus ion implantation, they may be introduced before the phosphorus ion implantation. In the latter case, as shown in FIG. 2D, boron ions are introduced in a state that the N-type TFT region is covered with a mask 214. Phosphorus ions may be introduced after the resist mask 214 is removed.

Figure 2E:
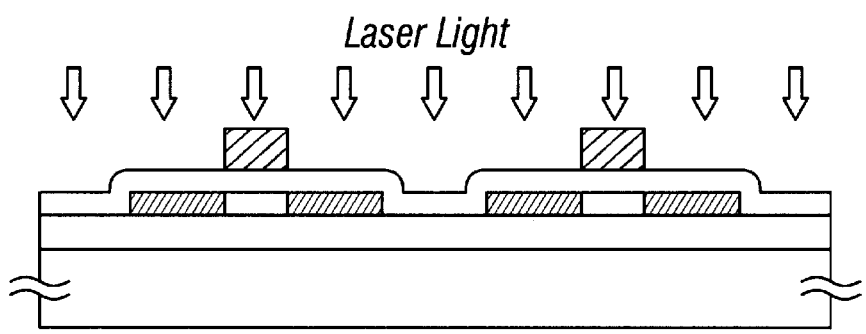

Then, after the resist mask 214 is removed, laser annealing is performed as shown in FIG. 2E to activate the added impurities and to restore the crystallinity of the island-like silicon regions 205 and 206 that have been damaged in the doping step. In this embodiment, since phosphorus is added to the N-type impurity regions 210 and 211 and the P type impurity regions 215 and 216 at a concentration of $3\times10^{19}$ atoms/cm$^3$, nickel is gettered by phosphorus upon laser light illumination. KrF excimer laser light (wavelength: 248 nm) is used. To getter nickel effectively, it is preferred that the laser light illumination conditions be such that the energy density is 200 to 400 mJ/cm$^2$, for instance, 250 mJ/cm$^2$, each point receives 2 to 20 shots of laser light, and the substrate temperature during the laser light illumination is set at 200° C.

In this process, nickel in the channel regions 21 and 22 is transferred into the source and drain regions 210, 211, 212 and 213 that phosphorus is doped. Thereby,concentration of nickel in the channel region 21 and 22 can be reduced.

After the laser annealing, thermal annealing is performed at 350° C. for 2 hours in a nitrogen atmosphere. Although both laser annealing and thermal annealing are performed in this embodiment, only one of those may be performed.

Figure 2F:
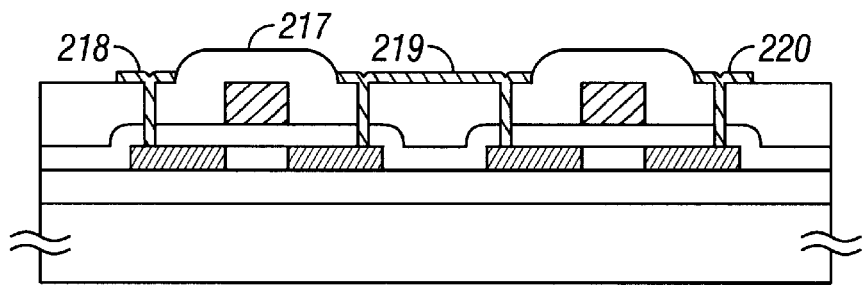

Subsequently, as shown in FIG. 2F, a 6,000-Å-thick silicon oxide film 216 as an interlayer insulating film is formed by plasma CVD. After contact holes are formed in the interlayer insulating film 217, electrodes/wiring lines 218 to 220 of the N-type and P-type TFTs are formed by using a metal material, for instance, a multi-layer film of titanium film and an aluminum film. Finally, a thermal treatment is performed at 350° C. for 2 hours in a hydrogen atmosphere. (FIG. 2F)

With the above steps, CMOS TFTs are completed in which the N-type TFT and the P-type TFT are combined complementarily.

Embodiment 4

This embodiment is directed to a method of producing an N-type semiconductor device having superior characteristics in manufacturing a thin-film transistor having a LDD structure by using a crystalline silicon film into which nickel as a catalyst element for accelerating crystallization has been introduced. More specifically, ions including phosphorus ions are implanted into source and drain regions and LDD regions by known ion doping (also called plasma doping), and then thermal annealing or optical annealing (or both) is performed to improve the crystallinity of the silicon film and activate impurities.

Figure 3:
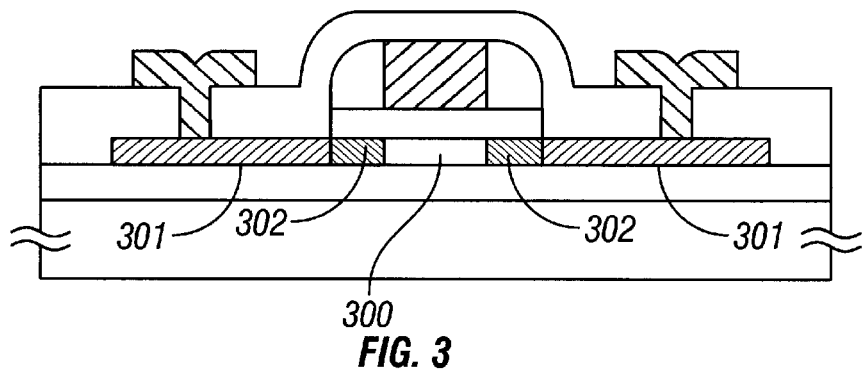
FIG. 3 shows a thin-film transistor according to a fourth embodiment of the invention.

The same steps as in the first embodiment are employed until formation of a crystalline silicon film. Thereafter, a thin-film transistor having a known LDD structure is formed by a known method. The source and drain regions and the LDD regions are activated in the same manner as in the first embodiment. FIG. 3 shows a TFT of a LDD structure having side walls.

As shown in FIG. 3, lightly doped impurity regions 302 having a lower impurity concentration than source and drain regions 301 are formed between the source and drain regions 301 and the channel region. One of the lightly doped impurity regions 302 which is located on the drain side is particularly called a LDD region.

In this embodiment, phosphorus is implanted in the source and drain regions 301 at $1\times10^{20}$ to $1\times10^{21}$ atoms/cm$_3$, and it is implanted in the lightly doped impurity regions 302 at $4\times10^{16}$ to $7\times10^{17}$ atoms/cm$^3$. With the doping of such concentrations, phosphorus can effectively getter nickel that has become unnecessary. Therefore, TFTs can be obtained in which the characteristics have only small variations among devices and off-currents are small.

Embodiment 5

This embodiment is directed to a method of producing a P-type semiconductor device having superior characteristics in manufacturing a thin-film transistor having a LDD structure by using a crystalline silicon film into which nickel as a catalyst element for accelerating crystallization has been introduced. More specifically, ions including phosphorus ions are implanted into LDD regions by known ion doping (also called plasma doping), then P-type impurity ions are implanted into source and drain regions and the LDD regions, and finally thermal annealing or optical annealing (or both) is performed to improve the crystallinity of the silicon film and activate impurities.

Manufacturing steps of this embodiment are almost the same as those in the fourth embodiment. This embodiment is different from the fourth embodiment in that the LDD regions 302 are doped with boron, as well as phosphorus, at a concentration of $3\times10^{17}$ to $3\times10^{18}$ atoms/cm$^3$ that is higher than that of phosphorus. The doping of boron inverts the conductivity type of the LDD regions 302 from an N-type to a P-type. The source and drain regions 301 are doped with boron, instead of phosphorus, at $3\times10^{19}$ to $1\times10^{21}$ atoms/cm$^3$, and therefore assume P-type conductivity.

The concentration of phosphorus in the LDD regions 302 is lower than that of boron in the source and drain regions 301 by 2 to 4 orders, the conductivity type of the LDD regions 302 can be inverted from an N-type to a P-type by introducing boron at a lower dose than that of the source and drain regions 301 is inverted. In inverting the conductivity type of the LDD regions 302 from an N-type to a P-type, the dose is so adjusted that the maximum concentration of boron implanted in the LDD regions 302 minus that of phosphorus implanted in those regions becomes $3 \times 10^{17}$ to $3 \times 10^{18}$ atoms/cm$^3$.

In this embodiment, in producing the P-type TFT, not only the impurity that imparts P-type conductivity such as boron but also nickel and phosphorus are introduced into the active layer made of a crystalline silicon film. Therefore, a silicon film having good crystallinity can be obtained at a low temperature in a short time due to the catalyst effect of nickel.

Nickel in the channel 300 is transferred into LDD regions 302 and source and drain regions 301 by the gettering function of phosphorus. Thereby, concentration of nickel in the channel region 300 can be reduced.

As a result, this embodiment can produce TFTs having superior electrical characteristics whose variations among devices are small.

Embodiment 6

This embodiment is directed to a method of producing a P-type semiconductor device having superior characteristics in manufacturing a thin-film transistor having a LDD structure by using a crystalline silicon film into which nickel as a catalyst element for accelerating crystallization has been introduced. More specifically, ions including phosphorus ions are implanted into source and drain regions and LDD regions by known ion doping (also called plasma doping), then P-type impurity ions are implanted into the source and drain regions and the LDD regions, and finally thermal annealing or optical annealing (or both) is performed to improve the crystallinity of the silicon film and activate impurities.

Manufacturing steps of this embodiment are almost the same as those in the fifth embodiment. This embodiment is different from the fifth embodiment in that the LDD regions 302 are doped with boron at a concentration of $3 \times 10^{19}$ to $1 \times 10^{21}$ atoms/cm$^3$ that is higher than that of phosphorus. The LDD regions 302 are also doped with boron at a concentration of $3 \times 10^{17}$ to $4 \times 10^{18}$ atoms/cm$^3$ that is higher than that of phosphorus. The doping of boron inverts the conductivity type of the source and drain regions 301 and the LDD regions 302 from an N-type to a P-type.

To this end, the doping conditions of boron are so determined that the maximum concentration of boron implanted in the source and drain regions 301 minus that of phosphorus implanted in those regions becomes $3 \times 10^{19}$ to $1 \times 10^{21}$ atoms/cm$^3$, and that the maximum concentration of boron implanted in the LDD regions 302 minus that of phosphorus implanted in those regions becomes $3 \times 10^{17}$ to $3 \times 10^{18}$ atoms/cm$^3$.

In this embodiment, in producing the P-type TFT, not only the impurity that imparts P-type conductivity such as boron but also nickel and phosphorus are introduced into the active layer made of a crystalline silicon film. Therefore, a silicon film having good crystallinity can be obtained at a low temperature in a short time due to the catalyst effect of nickel, and nickel can be gettered by phosphorus. As a result, this embodiment can produce TFTs having superior electrical characteristics whose variations among devices are small.

Embodiment 7

This embodiment is directed to a case of forming CMOS thin-film transistors in which an N-type thin-film transistor and a P-type thin-film transistor are combined complementarily. FIGS. 4A to 4H show a manufacturing process according to this embodiment. First, a silicon oxide film 402 as an undercoat film is deposited on a glass substrate (Corning 7059 or 1737) 401 at a thickness of, for instance, 2,000 Å, and a 500-Å-thick intrinsic (I-type) amorphous silicon film 403 is deposited thereon by plasma CVD.

Then, a very thin oxide film (not shown) is formed by oxidizing the surface of the amorphous silicon film 403 by UV oxidation. This oxide film improves the surface characteristics of the amorphous silicon film 403.

Thereafter, an acetate salt solution containing nickel at 1 to 30 ppm, for instance, 10 ppm, is applied by spin coating and then dried to form a nickel acetate layer 404. It is noted that the nickel acetate layer 404 forms a complete layer. (FIG. 4A) Subsequently, thermal annealing is performed at 550° C. for 4 hours in a nitrogen atmosphere, to crystallize the amorphous silicon film 403. In this heat treatment, the nickel acetate layer 404 is decomposed, and as nickel passes through the oxide film (not shown) and diffuses from the surface of the amorphous silicon film 403 to the undercoat silicon oxide film 402, crystallization of the amorphous silicon film 403 proceeds. After completion of the crystallization step, laser light may be applied to the substrate to improve the crystallinity of the crystallized silicon film.

If a metal element such as nickel exists in a crystallized silicon film at a higher concentration than $1 \times 10^{19}$ atoms/cm$^3$, silicon partly assumes metallic properties to lose its semiconductor characteristics. On the other hand, if the concentration of the metal element is lower than $1 \times 10^{15}$ atoms/cm$^3$, the effect of accelerating crystallization is not attained. Therefore, the concentration of nickel in the crystallized silicon film needs to be in a range of $1 \times 10^{15}$ to $1 \times 10^{19}$ atoms/cm$^3$. The nickel concentration of the acetate salt solution, the coating conditions of the acetate salt solution, and other conditions should be predetermined so as to attain the above nickel concentration in the crystallized silicon film.

Figure 4A:
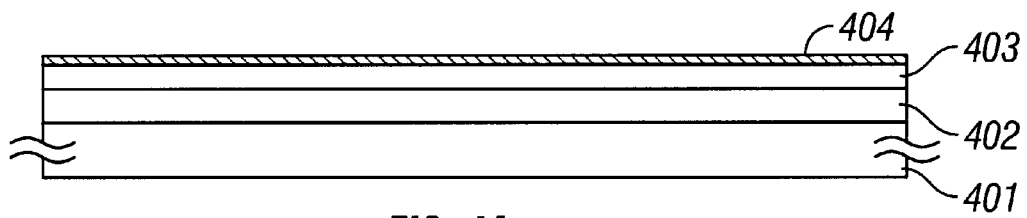
FIGS. 4A to 4H show a manufacturing process of a thin-film transistor according to a seventh embodiment of the invention.
Figure 4B:
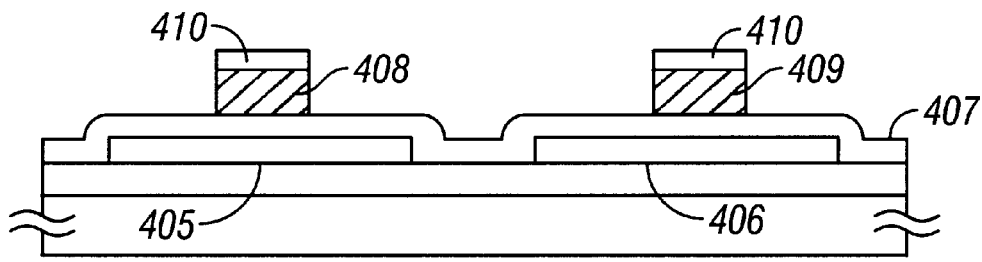

As shown in FIG. 4B, the crystallized silicon film is etched into island-like silicon regions 405 and 406. The island-like silicon regions 405 and 406 will constitute active layers of N-type and P-type TFTs, respectively.

Thereafter, a 1,500-Å-thick silicon oxide film 407 is deposited by plasma CVD, and a 4,000-Å-thick aluminum film, which is to constitute gate electrodes 408 and 409, is deposited thereon by sputtering. Scandium is added in advance to the aluminum film at 0.2 wt % to suppress occurrence of hillocks and whiskers.

Then, the aluminum film is anodized in an electrolyte to form a dense anodic oxide film (not shown) of about 100 Å in thickness. After a photoresist mask 410 is formed on the dense anodic oxide film, the aluminum film is patterned, to form gate electrodes 408 and 409. (FIG. 4B)

Figure 4C:
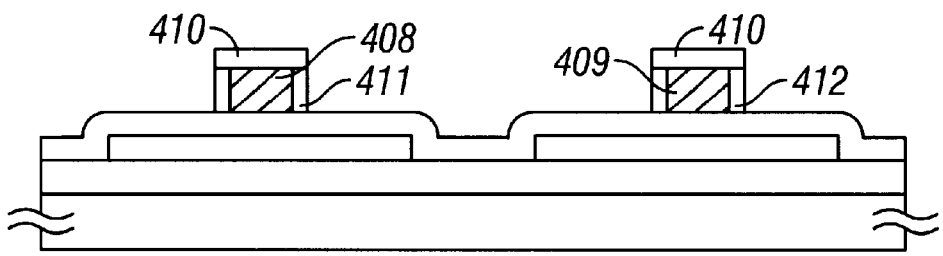

As shown in FIG. 4C, the gate electrodes 408 and 409 are again anodized with the photoresist mask 410 left as it is. As an electrolyte, an acid solution containing citric acid, oxalic acid, chromic acid, or sulphuric acid at 3 to 20%, for instance, a 3%-aqueous solution of oxalic acid, is used. Since the photoresist mask 410 and the dense anodic oxide film (not shown) exist on the surface of the gate electrodes 408 and 409, porous anodic oxide films 411 and 412 are formed on only the side faces of the gate electrodes 408 and 409. The length of the lightly doped impurity regions (LDD regions) is determined by the length of growth of the porous anodic oxide films 411 and 412, which can be controlled by the anodic oxidation processing time. In this embodiment, the porous anodic oxide films 411 and 412 are grown to have a length of 7,000 Å. (FIG. 4C)

Figure 4D:
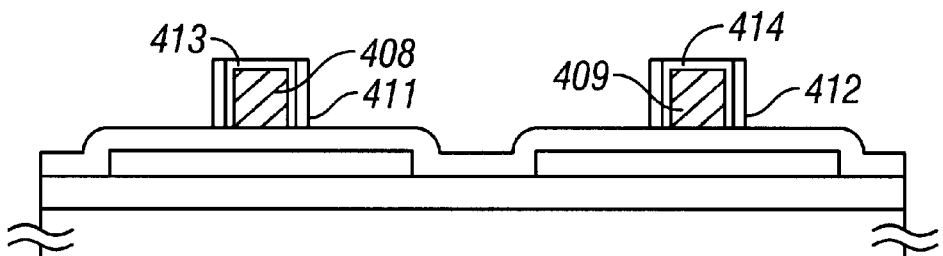

After elimination of the photoresist mask 410, the gate electrodes 408 and 409 are again subjected to anodic oxidation, to form dense, strong anodic oxide films 413 and 414. In this embodiment, an electrolyte is prepared by neutralizing a ethylene glycol solution containing tartaric acid at 3% with an aqueous solution of ammonia to pH 6.9. (FIG. 4D).

Subsequently, a silicon oxide film 407 is etched with the porous anodic oxide films 411 and 412 and the dense anodic oxide films 413 and 414 as a mask, to form gate insulating films 415 and 416. Either wet etching or dry etching can be used as long as it can etch the silicon oxide film 407 without etching the anodic oxide films 411 to 414. In this embodiment, the silicon oxide film 407 is etched by dry etching that uses a $ClF_3$ gas.

Figure 4E:
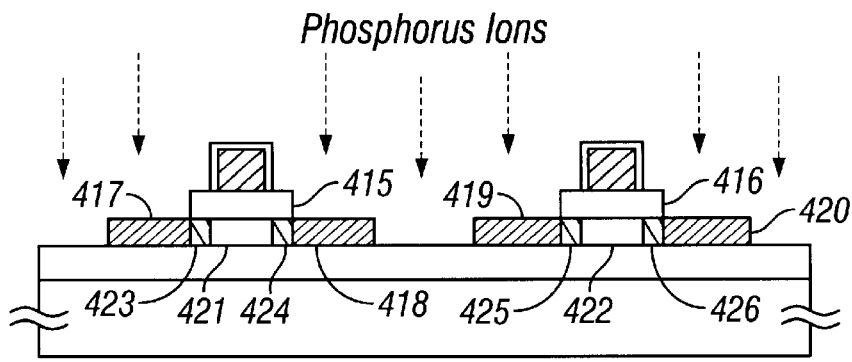

As shown in FIG. 4E, the dense anodic oxide films (not shown) and the porous anodic oxide films 411 and 412 are sequentially removed. The dense anodic oxide films (not shown) are removed with buffer hydrofluoric acid, and the porous anodic oxide films 411 and 412 are removed with a mixed acid of phosphoric acid, acetic acid and nitric acid. Since the porous anodic oxide films 411 and 412 can be removed easily, the dense, strong anodic oxide films 413 and 414 are never etched.

Then, impurities are implanted into the island-like silicon regions 405 and 406 by ion doping with the gate electrodes 408 and 409 used as a mask. In this embodiment, phosphine ($PH_3$) that is diluted with hydrogen to 1 to 10% is used as a doping gas to implant phosphorus first. The substrate is kept at the room temperature during the doping. The doping conditions such as the acceleration voltage, the dose, and the number of times of doping are properly set so as to allow the gate insulating films 415 and 416 to serve as a semi-transmissive mask.

The exposed portions of the island-like silicon regions 405 and 406 are doped with phosphorus ions at a high concentration, to form N-type heavily doped impurity regions 417 to 420, which become source and drain regions of TFTs. Since the portions right under the gate electrodes 408 and 409 are not doped with phosphorus ions, they become channel forming regions 421 and 422. As for the portions that are covered with only the gate insulating films 415 and 416, phosphorus ions are interrupted by the gate insulating films 415 and 416 and implanted into these portions by only a small amount. Therefore, these portions constitute N-type lightly doped impurity regions 423 to 426. (FIG. 4E)

In the above doping step, the doping conditions are so set that the concentration of phosphorus ions in the N-type heavily doping impurity regions 417 to 420 becomes $3\times10^{19}$ to $1\times10^{21}$ atoms/cm$^3$, and that the concentration of phosphorus ions in the lightly doped impurity regions 423 to 426 becomes $4\times10^{16}$ to $7\times10^{17}$ atoms/cm$^3$.

Figure 4F:
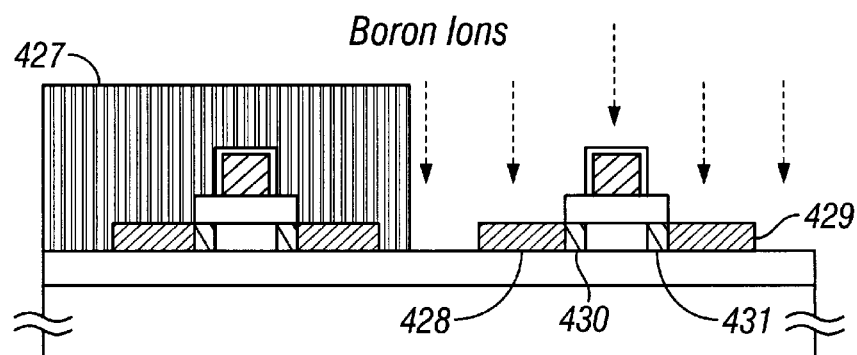

Subsequently, as shown in FIG. 4F, a resist film is formed, and its portion covering the region to become a P-type TFT is removed by patterning to leave a resist mask 427. Boron as an impurity to impart P-type conductivity is then implanted by ion doping, Diborane ($B_2H_6$) that is diluted with hydrogen to 5% is used as a doping gas. The substrate is kept at the room temperature during the ion doping. As a result, in the island-like silicon region 406, the N-type conductivity of the heavily doped impurity regions 419 and 420 and the lightly doped impurity regions 425 and 426 is inverted to P-type conductivity; that is, P-type heavily doped impurity regions 428 (source) and 429 (drain) and P-type lightly doped impurity regions 430 and 431 are formed. On the other hand, the N-type conductivity of the heavily doped impurity regions 417 (source) and 418 (drain) and the lightly doped impurity regions 423 and 424 is maintained.

The doping conditions are so determined that the concentration of boron in the P-type heavily doped impurity regions 428 and 429 (source and drain regions) becomes higher than that of phosphorus in those regions by $3\times10^{19}$ to $1\times10^{21}$ atoms/cm$^3$, and that the concentration of boron in the P-type lightly doped impurity regions 430 and 431 becomes higher than that of phosphorus in those regions by $3\times10^{17}$ to 433 $10^{18}$ atoms/cm$^3$.

Figure 4G:
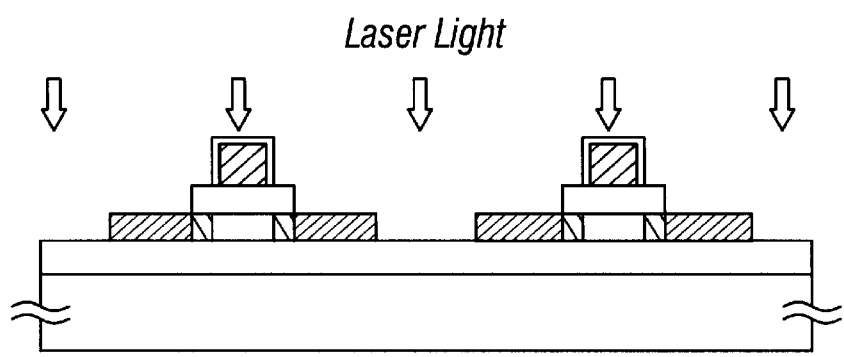

As shown in FIG. 4G, after the resist mask 214 is removed, laser annealing is performed to activate the introduced impurities and to restore the crystallinity of the island-like silicon regions 405 and 406 that have been damaged in the doping steps.

In this embodiment, the N-type or P-type source and drain regions 417, 418, 428 and 429 are doped with phosphorus at a concentration of $1\times10^{20}$ to $1\times10^{21}$ atoms/cm$^3$, and the N-type or P-type lightly doped regions 423, 424, 430 and 431 are doped with phosphorus at a concentration of $4\times10^{16}$ to $7\times10^{17}$ atoms/cm$^3$. Therefore, nickel can be effectively gettered by phosphorus upon laser light illumination.

Where KrF excimer laser light (wavelength: 248 nm) is used, to getter nickel effectively, it is preferred that the laser light illumination conditions be such that the energy density is 200° C. to 400 mJ/cm$^2$, for instance, 250 mJ/cm$^2$, each point receives 2 to 20 shots of laser light, and the substrate temperature during the laser light illumination is set at 200° C.

After the laser annealing, thermal annealing is performed at 350° C. for 2 hours in a nitrogen atmosphere. Although both laser annealing and thermal annealing are performed in this embodiment, only one of those may be performed.

Figure 4H:
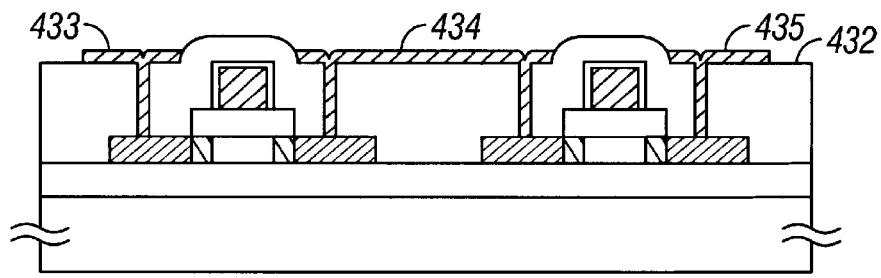

As shown in FIG. 4H, a 1-μm-thick silicon oxide film as an interlayer insulating film 432 is deposited by plasma CVD, and contact holes are formed therein. Source and drain electrodes/wiring lines 433 to 435 are formed through the contract holes by using a metal material such as a multi-layer film of a titanium film and an aluminum film. Finally, a heat treatment is performed at 350° C. for 2 hours in a hydrogen atmosphere. With the above steps, CMOS thin-film transistors are completed. (FIG. 4H)

Although in this embodiment boron ions are introduced after the phosphorus ion implantation, they may be introduced before the phosphorus ion implantation. In the latter case, as shown in FIG. 4F, boron ions are introduced in a state that the N-type TFT region is covered with a resist mask 427. Phosphorus ions may be introduced after the resist mask 427 is removed.

The invention enables formation of thin-film transistors in which off-currents are small and variations in characteristics are small, even with the use of a crystalline silicon film into which a catalyst element for accelerating crystallization has been introduced.

In particular, where nickel is used as the catalyst element for accelerating crystallization, the above effects of the invention is remarkable. The above effects are particularly advantageous in forming a plurality of devices having the same functions on the same substrate. This is because an off-current variation among devices causes unevenness in characteristics among the devices. Such unevenness is particularly harmful to pixels that are formed in a TFT liquid crystal display device. Thus, the invention is believed very useful in the industrial point of view.

What is claimed is:

1. A method of manufacturing a semiconductor device having at least an NTFT and a PTFT, comprising:

disposing a semiconductor film comprising silicon over a substrate;

crystallizing said semiconductor film;

patterning said semiconductor film into at least first and second semiconductor islands, each including a channel region;

forming a gate electrode over each of said first and second semiconductor islands with a gate insulating film interposed therebetween;

introducing phosphorus ions into both of said first and second semiconductor islands by using at least in part said gate electrodes as masks, thereby forming a pair of heavily doped regions with a first concentration approximately from $3\times10^{19}$ to $1\times10^{21}$ atoms/cm$^3$ and a pair of lightly doped regions with a second concentration approximately from $4\times10^{16}$ to $7\times10^{17}$ atoms/cm$^3$, said lightly doped regions being interposed between said channel region and said heavily doped regions, respectively;

introducing boron ions into only one of said first and second semiconductor islands by using at least in part said gate electrode as a mask to dope said heavily doped regions with a third concentration larger than said first concentration by a first difference approximately from $3\times10^{19}$ to $1\times10^{21}$ atoms/cm$^3$ and to dope said lightly doped regions at a fourth concentration larger than said second concentration by a second difference approximately from $3\times10^{17}$ to $4\times10^{18}$ atoms/cm$^3$; and annealing said heavily and lightly doped regions of said first and second semiconductor islands after said introducing of said phosphorus ions, said annealing activating said phosphorus ions to getter a metal material in said each channel region.

2. A method according to claim 1, wherein said gate insulating film on each of said first and second semiconductor islands extends beyond side edges of said gate electrode to cover said lightly doped regions, leaving said heavily doped regions exposed.

3. A method according to claim 1 wherein said phosphorous ions are introduced into said lightly doped regions of said first and second semiconductor islands through an extended portion of said gate insulating film covering said lightly doped regions.

4. A method according to claim 3 wherein said boron ions are introduced into said light doped regions of said only one of said first and second semiconductor islands through said extended portion of said gate insulating film covering said lightly doped regions.

5. A method according to claim 3 wherein said extended portion of said gate insulating film covering said lightly doped regions operates to attenuate dosage of doping ions going therethrough.

6. A method of manufacturing a semiconductor device having at least a NTFT and an PTFT, comprising:

disposing a semiconductor film comprising silicon over a substrate;

crystallizing said semiconductor film;

patterning said semiconductor film into at least first and second semiconductor islands disposed relative to each other, each including a channel region;

forming a gate electrode over each of said first and second semiconductor islands with a gate insulating film interposed therebetween;

introducing phosphorous ions into both of said first and second semiconductor islands by at least in part using said gate electrodes as masks, thereby at each of said first and second semiconductor islands forming a pair of lightly doped regions that are adjacent to said channel region and opposing to each other with respect to said channel region and a pair of heavily doped regions each located on one side of said channel region and in direct contact with one of said lightly doped regions, wherein said heavily doped regions are doped at a first concentration and said lightly doped regions are doped at a second concentration smaller than said first concentration by a first difference amount;

introducing boron ions into only one of said first and second semiconductor islands by using at least in part said gate electrode as a mask to dope said heavily doped regions at a third concentration and said lightly doped regions at a fourth concentration larger than said second concentration, said third concentration being larger than said fourth concentration by a second difference amount that is smaller than said first difference amount; and annealing first and second semiconductor islands, said annealing activating said phosphorus ions to getter a metal material in said each channel region.

7. A method according to claim 6 wherein said gate insulating film on each of said first and second semiconductor islands extends beyond side edges of said gate electrode to cover said lightly doped regions, leaving said heavily doped regions exposed.

8. A method according to claim wherein 6 said phosphorous ions are introduced into said lightly doped regions of said first and second semiconductor islands through an extended portion of said gate insulating film covering said lightly doped regions.

9. A method according to claim 8 wherein said boron ions are introduced into said lightly doped regions of said only one of said first and second semiconductor islands through said extended portion of said gate insulating film covering said lightly doped regions.

10. A method according to claim 8 wherein said extended portion of said gate insulating film covering said lightly doped regions operates to attenuate dosage of doping ions going therethrough.

11. A method according to claim 6, further comprising disposing said metal material in contact with said semiconductor film before said crystallizing.

12. A method of manufacturing a semiconductor device comprising:

disposing a semiconductor film over a substrate;

crystallizing said semiconductor film;

forming an insulating film in contact with said semiconductor film;

forming a gate electrode in contact with said insulating film;

selectively introducing phosphorus into said semiconductor film;

selectively introducing boron into said semiconductor film, to form at least a source region and a drain region; and annealing first and second semiconductor islands, said annealing activating said phosphorus ions to getter a metal material in a channel region of said semiconductor film, wherein a concentration of said phosphorus in said source region and said drain region is $3 \times 10^{19}$ through $1 \times 10^{21}$ atoms/cm$^3$, and a concentration of said boron in said source region and said drain region is larger than said phosphorus concentration in said source region and said drain region by a difference of $3 \times 10^{19}$ through $1 \times 10^{21}$ atoms/cm$^3$.

13. A method according to claim 12, further comprising disposing said metal material in contact with said semiconductor film before said crystallizing.

14. A method of manufacturing a semiconductor device including a p channel thin film transistor and an n channel thin film transistor, comprising:

disposing a semiconductor film over a substrate;

crystallizing said semiconductor film;

patterning said semiconductor film into at least first and second semiconductor films disposed relative to each other, each including a channel region;

selectively introducing phosphorus into said first semiconductor film and said second semiconductor film, thereby at least a first source region, a first drain region and an LDD region adjacent to said first drain region are defined in said first semiconductor film;

selectively introducing boron into only said second semiconductor film, to form at least a second source region and a second drain region in said second semiconductor film; and annealing said first and second semiconductor films, said annealing activating said phosphorus to getter a metal material in first and second channel regions of said first and second semiconductor films, wherein a concentration of said phosphorus in said first source region, said first drain region, said second source region and said second drain region is $3 \times 10^{19}$ through $1 \times 10^{21}$ atoms/cm$^3$, a concentration of said phosphorus in said LDD region is $4 \times 10^{16}$ through $7 \times 10^{17}$ atoms/cm$^3$, and a concentration of said boron in said second source region and said second drain region is larger than said phosphorus concentration in said second source region and said second drain region by a difference of $3 \times 10^{19}$ through $1 \times 10^{21}$ atoms/cm$^3$.

15. A method according to claim 14, further comprising disposing said metal material in contact with said semiconductor film before said crystallizing.

16. A method of manufacturing a semiconductor device comprising:

disposing a semiconductor film over a substrate;

crystallizing said semiconductor film;

forming an insulating film in contact with said semiconductor film;

forming a gate electrode in contact with said insulating film;

selectively introducing phosphorus into said semiconductor film;

selectively introducing boron into said semiconductor film, to form at least a source region and a drain region; and annealing said semiconductor film, said annealing activating said phosphorus to getter a metal material in a channel region of said semiconductor film into regions to which said phosphorus is introduced, wherein a concentration of said phosphorus in said source region and said drain region is $3 \times 10^{19}$ through $1 \times 10^{21}$ atoms/cm$^3$, and a concentration of said boron in said source region and said drain region is larger than said concentration of phosphorus in said source region and said drain region by a difference of $3 \times 10^{19}$ through $1 \times 10^{21}$ atoms/cm$^3$.

17. A method according to claim 16, further comprising disposing said metal material in contact with said semiconductor film before said crystallizing.

18. A method of manufacturing a semiconductor device including a p channel thin film transistor and an n channel thin film transistor, comprising:

disposing a semiconductor film over a substrate;

crystallizing said semiconductor film;

patterning said semiconductor film into at least first and second semiconductor films disposed relative to each other, each including a channel region;

selectively introducing phosphorus into said first semiconductor film and said second semiconductor film, thereby at least a first source region, a first drain region and an LDD region adjacent to said first drain region are defined in said first semiconductor film;

selectively introducing boron into only said second semiconductor film, to form at least a second source region and a second drain region in said second semiconductor film; and annealing said first and second semiconductor films, said annealing activating said phosphorus to getter a metal material in first and second channel regions of said first and second semiconductor films into said first and second source and drain regions, wherein a concentration of said phosphorus in said first source region said first drain region, said second source region and said second drain region is $3 \times 10^{19}$ through $1 \times 10^{21}$ atoms/cm$^3$, a concentration of said phosphorus in said LDD region is $4 \times 10^{16}$ through $7 \times 10^{17}$ atoms/cm$^3$, and a concentration of said boron in said second source region and said second drain region is larger than said phosphorus concentration in said second source region and said second drain region by a difference of $3 \times 10^{19}$ through $1 \times 10^{21}$ atoms/cm$^3$.

19. A method according to claim 18, further comprising disposing said metal material in contact with said semiconductor film before said crystallizing.

20. A method of manufacturing a semiconductor device comprising:

disposing a semiconductor film over a substrate; crystallizing said semiconductor film;

forming an insulating film in contact with said semiconductor film;

forming a gate electrode in contact with said insulating film;

selectively introducing phosphorous into said semiconductor film;

selectively introducing p type impurity into said semiconductor film, to form at least a source region and a drain region; and annealing said semiconductor film, said annealing activating said phosphorus to getter a metal material in a channel region of said semiconductor film, wherein a concentration of said n type impurity in said source region and said drain region is $3 \times 10^{19}$ through $1 \times 10^{21}$ atoms/cm$^3$, and a concentration of said p type impurity in said source region and said drain region is larger than said concentration of said n type impurity in said source and drain regions by a difference of $3\times10^{19}$ through $1\times10^{21}$ atoms/cm$^3$.

21. A method according to claim 20, further comprising disposing said metal material in contact with said semiconductor film before said crystallizing.

22. A method of manufacturing a semiconductor device including a p channel thin film transistor and an n channel thin film transistor, comprising:

disposing a semiconductor film over a substrate;

crystallizing said semiconductor film;

patterning said semiconductor film into at least first and second semiconductor films disposed relative to each other, each including a channel region;

selectively introducing phosphorous into said first semiconductor film and said second semiconductor film, thereby at least a first source region, a first drain region and an LDD region adjacent to said first drain region are defined in said first semiconductor film;

selectively introducing a p type impurity into only said second semiconductor film, to form at least a second source region and a second drain region in said first semiconductor film; and annealing said first and second semiconductor films, said annealing activating said phosphorus to getter a metal material in first and second channel regions of said first and second semiconductor films, wherein a concentration of said n type impurity in said first source region, said first drain region, said second source region and said second drain region is $3\times10^{19}$ through $1\times10^{21}$ atoms/cm$^3$, a concentration of said n type impurity in said LDD region is $4\times10^{16}$ through $7\times10^{17}$ atoms/cm$^3$, and a concentration of said p type impurity in said second source region and said second drain region is larger than said concentration of said n type impurity in said second source region and said second drain region by a difference of $3\times10^{19}$ through $1\times10^{21}$ atoms/cm$^3$.

23. A method according to claim 22, further comprising disposing said metal material in contact with said semiconductor film before said crystallizing.

24. A method of manufacturing a semiconductor device including a p channel thin film transistor and an n channel thin film transistor, comprising:

disposing a semiconductor film comprising silicon over a substrate;

crystallizing said semiconductor film;

patterning said semiconductor film into at least first and second semiconductor islands, each including a channel region;

forming a gate electrode over each of said first and second semiconductor islands with a gate insulating film interposed therebetween;

introducing phosphorus into both of said first and second semiconductor islands, thereby forming a pair of heavily doped regions with a first concentration and a pair of lightly doped regions with a second concentration, said lightly doped regions being interposed between said channel region and said heavily doped regions, respectively;

introducing boron into only one of said first and second semiconductor islands to dope said boron ions into said heavily doped regions with a third concentration larger than said first concentration and to dope said boron ions into said lightly doped regions at a fourth concentration larger than said second concentration; and annealing said first and second semiconductor islands, said annealing activating said phosphorus to getter metal materials in said each channel region.

25. A method according to claim 24, further comprising disposing said metal material in contact with said semiconductor film before said crystallizing.

26. A method according to claim 24, wherein said crystallizing is performed by heating.

27. A method according to claim 24, wherein said introducing said phosphorus and said boron are performed by ion doping.

28. A method according to claim 24, wherein said introducing said phosphorus and said boron are performed by ion implantation.

29. A method according to claim 24, further comprising irradiating said semiconductor film with a light.

30. A method of manufacturing a semiconductor device including a p channel thin film transistor and an n channel thin film transistor, comprising:

disposing a semiconductor film comprising silicon over a substrate;

crystallizing said semiconductor film;

patterning said semiconductor film into at least first and second semiconductor islands disposed relative to each other, each including a channel region;

forming a gate electrode over each of said first and second semiconductor islands with a gate insulating film interposed therebetween;

introducing phosphorous into both of said first and second semiconductor islands, thereby a pair of lightly doped regions and a pair of heavily doped regions are formed in each of said first and second semiconductor islands, wherein said heavily doped regions are doped at a first concentration and said lightly doped regions are doped at a second concentration smaller than said first concentration;

introducing boron into only one of said first and second semiconductor islands, thereby said boron are introduced into said heavily doped regions and said lightly doped regions at a third concentration larger than said first and second concentrations; and annealing first and second semiconductor islands, said annealing activating said phosphorus to getter a metal material in said each channel region.

31. A method according to claim 30, further comprising disposing said metal material in contact with said semiconductor film before said crystallizing.

32. A method according to claim 30, wherein said crystallizing is performed by heating.

33. A method according to claim 30, wherein said introducing said phosphorus and said boron are performed by ion doping.

34. A method according to claim 30, wherein said introducing said phosphorus and said boron are performed by ion implantation.

35. A method according to claim 30, further comprising irradiating said semiconductor film with a light.

36. A method of manufacturing a semiconductor device comprising:

disposing a semiconductor film over a substrate;

crystallizing said semiconductor film;

forming an insulating film in contact with said semiconductor film;

forming a gate electrode in contact with said insulating film;

selectively introducing phosphorus into said semiconductor film;

selectively introducing boron into said semiconductor film, to form at least a source region and a drain region; and annealing said semiconductor film, said annealing activating said phosphorus to getter a metal material in a channel region of said semiconductor film, wherein a concentration of said boron in said source region and said drain region is larger than that of said phosphorus in said source region and said drain region.

37. A method according to claim 36, further comprising disposing said metal material in contact with said semiconductor film before said crystallizing.

38. A method according to claim 36, wherein said crystallizing is performed by heating.

39. A method according to claim 36, wherein said introducing said phosphorus and said boron are performed by ion doping.

40. A method according to claim 36, wherein said introducing said phosphorus and said boron are performed by ion implantation.

41. A method according to claim 36, further comprising irradiating said semiconductor film with a light.

42. A method of manufacturing a semiconductor device including a p channel thin film transistor and an n channel thin film transistor, comprising:

disposing a semiconductor film over a substrate;

crystallizing said semiconductor film;

patterning said semiconductor film into at least first and second semiconductor films disposed relative to each other, each including a channel region;

selectively introducing phosphorus into said first semiconductor film and said second semiconductor film;

selectively introducing boron into only said second semiconductor film; and annealing said semiconductor film, said annealing activating said phosphorus to getter a metal material in first and second channel regions of said first and second semiconductor films, wherein a concentration of said boron in said second semiconductor film is larger than a phosphorus concentration in said second semiconductor film.

43. A method according to claim 42, further comprising disposing said metal material in contact with said semiconductor film before said crystallizing.

44. A method according to claim 42, wherein said crystallizing is performed by heating.

45. A method according to claim 42, wherein said introducing said phosphorus and said boron are performed by ion doping.

46. A method according to claim 42, wherein said introducing said phosphorus and said boron are performed by ion implantation.

47. A method according to claim 42, further comprising irradiating said first and second semiconductor films with a light.

48. A method of manufacturing a semiconductor device comprising:

disposing a semiconductor film over a substrate;

crystallizing said semiconductor film;

forming an insulating film in contact with said semiconductor film;

forming a gate electrode in contact with said insulating film;

selectively introducing phosphorus into said semiconductor film;

selectively introducing boron into said semiconductor film, to form at least a source region and a drain region; and annealing said semiconductor film, said annealing activating said phosphorus to getter a metal material in a channel region of said semiconductor film to regions to which said phosphorus is introduced, wherein a concentration of said boron in said source region and said drain region is larger than said concentration of phosphorus in said source region and said drain region.

49. A method according to claim 48 further comprising disposing said metal material in contact with said semiconductor film before said crystallizing.

50. A method according to claim 48 wherein said crystallizing is performed by heating.

51. A method according to claim 48 wherein said introducing said phosphorus and said boron are performed by ion doping.

52. A method according to claim 48 wherein said introducing said phosphorus and said boron are performed by ion implantation.

53. A method according to claim 48 further comprising irradiating said semiconductor film with a light.

54. A method of manufacturing a semiconductor device including a p channel thin film transistor and an n channel thin film transistor, comprising:

disposing a semiconductor film over a substrate;

crystallizing said semiconductor film;

patterning said semiconductor film into at least first and second semiconductor films disposed relative to each other, each including a channel region;

selectively introducing phosphorus into said first semiconductor film and said second semiconductor film, thereby at least a first source region, a first drain region and an LDD region adjacent to said first drain region are defined in said first semiconductor film;

selectively introducing boron into only said second semiconductor film, to form at least a second source region and a second drain region in said second semiconductor film; and annealing said first and second semiconductor films, said annealing activating said phosphorus to getter a metal material in first and second channel regions of said first and second semiconductor films to said first and second source and drain regions, wherein a concentration of said boron in said second source region and said second drain region is larger than a phosphorus concentration in said second source region and said second drain region.

55. A method according to claim 54, further comprising disposing said metal material in contact with said semiconductor film before said crystallizing.

56. A method according to claim 54, wherein said crystallizing is performed by heating.

57. A method according to claim 54, wherein said introducing said phosphorus and said boron are performed by ion doping.

58. A method according to claim 54, wherein said introducing said phosphorus and said boron are performed by ion implantation.

59. A method according to claim 54, further comprising irradiating said first and second semiconductor films with a light.

60. A method of manufacturing a semiconductor device including a p channel thin film transistor, comprising:

disposing a semiconductor film over a substrate;

crystallizing said semiconductor film;

forming an insulating film in contact with said semiconductor film;

forming a gate electrode in contact with said insulating film;

selectively introducing phosphorous into said semiconductor film;

selectively introducing a p type impurity into said semiconductor film, to form at least a source region and a drain region; and annealing said semiconductor film, said annealing activating said phosphorus to getter a metal material in a channel region of said semiconductor film, wherein a concentration of said p type impurity in said source region and said drain region is larger than a concentration of said n type impurity in said source and drain regions.

61. A method according to claim 60, further comprising disposing said metal material in contact with said semiconductor film before said crystallizing.

62. A method according to claim 60, wherein said crystallizing is performed by heating.

63. A method according to claim 60, wherein said introducing said phosphorous and said p type impurity are performed by ion doping.

64. A method according to claim 60, wherein said introducing said phophorous and said p type impurity are performed by ion implantation.

65. A method according to claim 60, further comprising irradiating said semiconductor film with a light.

66. A method of manufacturing a semiconductor device including a p channel thin film transistor and an n channel thin film transistor, comprising:

disposing a semiconductor film over a substrate;

crystallizing said semiconductor film;

patterning said semiconductor film into at least first and second semiconductor films disposed relative to each other, each including a channel region;

selectively introducing phophorous into said first semiconductor film and said second semiconductor film, thereby at least a first source region, a first drain region and an LDD region adjacent to said first drain region are defined in said first semiconductor film;

selectively introducing a p type impurity into only said second semiconductor film, to form at least a second source region and a second drain region in said first semiconductor film; and annealing said first and second semiconductor films, said annealing activating said phosphorus to getter a metal material in first and second channel regions of said first and second semiconductor films, wherein a concentration of said p type impurity in said second source region and said second drain region is larger than said concentration of said n type impurity in said second source region and said second drain region.

67. A method according to claim 66, further comprising disposing said metal material in contact with said semiconductor film before said crystallizing.

68. A method according to claim 66, wherein said crystallizing is performed by heating.

69. A method according to claim 66, wherein said introducing said phosphorous impurity and said p type impurity are performed by ion doping.

70. A method according to claim 66, wherein said introducing said phosphorous and said p type impurity are performed by ion implantation.

71. A method according to claim 66, further comprising irradiating said first and second semiconductor films with a light.

* * * * *